United States Patent
Farkas et al.

(10) Patent No.: US 12,328,211 B2
(45) Date of Patent: *Jun. 10, 2025

(54) COMMON MODE NOISE MEASUREMENT IN A DATA COMMUNICATION INTERFACE RECEIVER

(71) Applicant: DELL PRODUCTS L.P., Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/343,373

(22) Filed: Jun. 28, 2023

(65) Prior Publication Data

US 2025/0007760 A1 Jan. 2, 2025

(51) Int. Cl.
*H04B 17/20* (2015.01)
*H04L 25/08* (2006.01)
*H03F 3/45* (2006.01)

(52) U.S. Cl.
CPC ......... *H04L 25/085* (2013.01); *H04B 17/204* (2023.05); *H03F 3/45475* (2013.01)

(58) Field of Classification Search
CPC .......................... H04L 25/085; H03F 3/45475
See application file for complete search history.

(56) References Cited

U.S. PATENT DOCUMENTS

| | | |
|---|---|---|
| 6,850,423 B2 | 2/2005 | Lanni |
| 11,199,933 B2 | 12/2021 | Krah et al. |
| 2014/0079106 A1* | 3/2014 | Thelen ................ H04L 25/0276 375/224 |

OTHER PUBLICATIONS

U.S. Appl. No. 18/343,416, filed Jun. 28, 2023, CPC Classification H04L25/0276, US Classification 375/224.*

* cited by examiner

*Primary Examiner* — Rahel Guarino
(74) *Attorney, Agent, or Firm* — Larson Newman, LLP

(57) ABSTRACT

A receiver for a high-speed data communication interface includes a differential data signal input, a first termination resistor, a second termination resistor, and a noise measurement node. The differential data signal input includes a positive signal input and a negative signal input. The first termination resistor terminates the positive signal input to a reference voltage node. The second termination resistor terminates the negative signal input to the reference voltage node. The noise measurement node is coupled to detect common mode noise at the reference voltage node.

20 Claims, 3 Drawing Sheets

COMMON MODE NOISE MEASUREMENT IN A DATA COMMUNICATION INTERFACE RECEIVER

RELATED APPLICATION

This application is related to U.S. patent application Ser. No. 18/343,416, entitled "COMMON MODE NOISE MEASUREMENT IN MULTIPLE DATA COMMUNICATION INTERFACE RECEIVERS," filed on Jun. 28, 2023, which is hereby incorporated by reference.

FIELD OF THE DISCLOSURE

This disclosure generally relates to information handling systems, and more particularly relates to noise cancellation in low-speed signals.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A receiver for a high-speed data communication interface may include a differential data signal input, a first termination resistor, a second termination resistor, and a noise measurement node. The differential data signal input may include a positive signal input and a negative signal input. The first termination resistor may terminate the positive signal input to a reference voltage node. The second termination resistor may terminate the negative signal input to the reference voltage node. The noise measurement node may be coupled to detect common mode noise at the reference voltage node.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
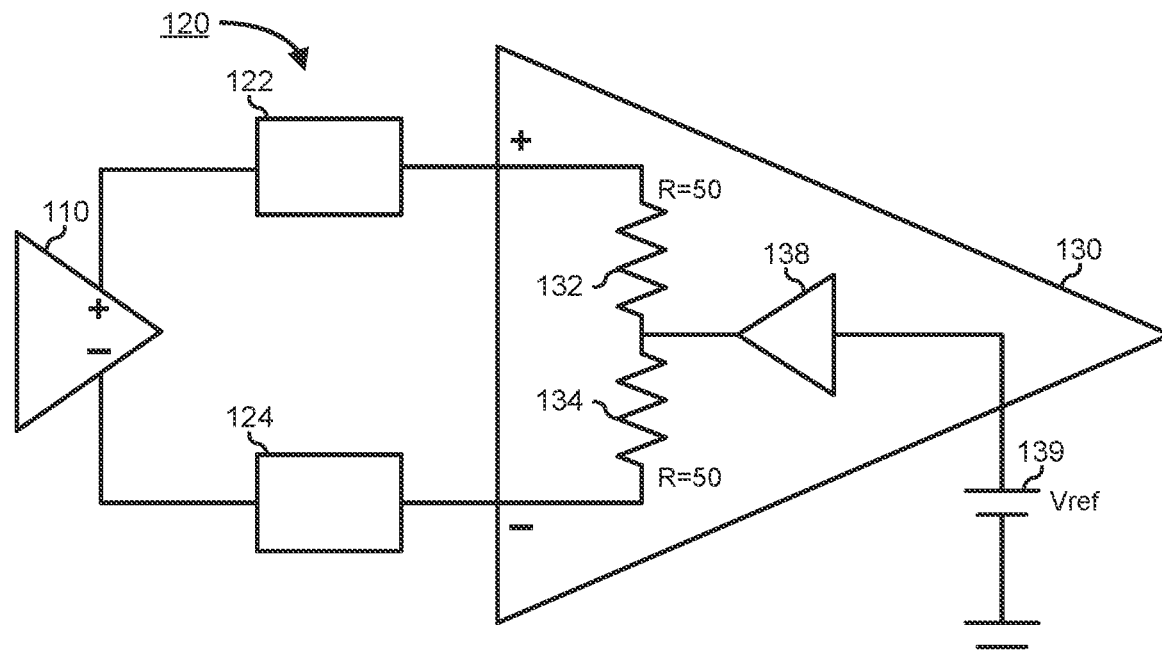
FIG. 1 is a block diagram of a high-speed differential signal data communication interface as may be known in the art.

FIG. 1 illustrates a high-speed differential signal data communication interface 100 (hereinafter "interface 100"), as may be known in the art. Interface 100 includes a high-speed differential signal data communication interface transmitter 110 (hereinafter "transmitter 110"), a differential signal channel 120 (hereinafter "channel 120"), and a high-speed differential signal data communication receiver 130 (hereinafter "receiver 130"). Transmitter 110 is configured to receive data and to convert the data into a differential signal having a positive representation of the data on a positive output (+) of the transmitter, and a negative representation of the data on a negative output (−). The positive output (+) is connected to a positive trace 122 of channel 120, and the negative output (−) is connected to a negative trace 124 of the channel. Positive trace 122 and negative trace 124 represent tightly electrically coupled circuit paths that transmit the data from transmitter 110 to receiver 130, and may include traces of a differential signal trace pair instantiated on a printed circuit board (PCB), as contacts of a differential signal pair instantiated on a connector, a differential signal cable such as a twisted pair cable, or as other signal elements for carrying closely coupled differential signals as needed or desired Receiver 130 includes termination resistors 132 and 134, a reference voltage buffer 138, and a voltage source 139. Receiver 130 is configured to receive the data from channel 120. In particular, receiver 130 includes a positive input (+) connected to positive signal trace 122. Further, receiver 130 includes a negative input (−) connected to negative signal trace 124. Differential signaling, the communication of differential signals on a differential signal channel, the fabrication of differential signal channels, and the like, are known in the art and will not be further described herein, except as may be needed to illustrate the current embodiments. Thus receiver 130 is configured to receive the data from channel 120 in the form of a differential signal as described above, and to provide the data on an output of the receiver (not illustrated). The receiving of differential signals and interpreting the differential signals into a data stream, and the circuits and components utilized therefore, are known in the art and will not be further described herein, except as may be needed to illustrate the current embodiments.

Channel 120 is terminated in receiver 130 by termination resistors 132 and 134. In particular, a first terminal of termination resistor 132 is connected at the positive input (+) of receiver 130 to positive signal trace 122, and a first terminal of termination resistor 134 is connected at the negative input (−) of the receiver to negative signal trace 122. Second terminals of termination resistors 132 and 134 are connected together to form a reference voltage node. An input of reference voltage buffer 138 is connected to a voltage plane at a reference voltage for the high-speed differential signal data communication interface by voltage source 139, and an output of the reference voltage buffer provides the reference voltage to the reference voltage node.

Differential signaling is known to provide various advantages over single-ended signaling. In particular, because a positive representation of the data is carried on the positive signal trace, a negative representation of the data is carried on the negative signal trace, and the received data is referenced to a reference voltage around which the positive and negative signals vary, the data can be more affirmatively detected by the receiver. Moreover, the positive signal trace and the negative signal trace are typically tightly electrically coupled together. Hence any noise induced onto one of the signal traces will also be induced onto the other signal trace. Such noise that is induced onto both traces of a channel is referred to as common mode (CM) noise. The differential nature of receiver results in the CM noise being cancelled in the receiver. Tightly coupled signal traces are traces that are physically located in close proximity with each other, have substantially equal lengths, and have similar channel routings. For example, particularly within a PCB, tightly coupled trace routing requires that the traces are routed similarly to each other with strip line traces, microstrip traces, and inter-metal layer vias being located as close together as physically possible given the various design rules for the particular high-speed differential signal data communication interface.

It has been understood that, as the speed of differential signal data communication interfaces has increased, and the threshold voltages have decreased, smaller and more minor variances in the proximity, length, and trace routings of the positive and negative signal traces have had a greater impact on the CM noise immunity afforded by differential signal data communication interfaces. For example, the small distance between the positive and negative signal traces, or minor differences in length may result in the CM noise pulses arriving at the receiver slightly out of phase with each other. Hence the CM noise induced into each trace is not adequately cancelled out by the differential input. Particularly with higher speeds and lower voltage margins, inadequately suppressed CM noise in a receiver of a high-speed differential signal data communication interface my result in data errors. A step in understanding the CM noise immunity of a receiver of a high-speed differential signal data communication interface is achieving a meaningful measurement of the CM noise present at the input of the receiver. Such an understanding may be crucial to a design development or debugging of the receiver. Typical methods for measuring noise on a channel include adding probes at the receiver input, but such methods add circuit elements that either induce their own noise into the measurement, or inadequately model the actual receiver circuit to provide meaningful results.

Figure 2:
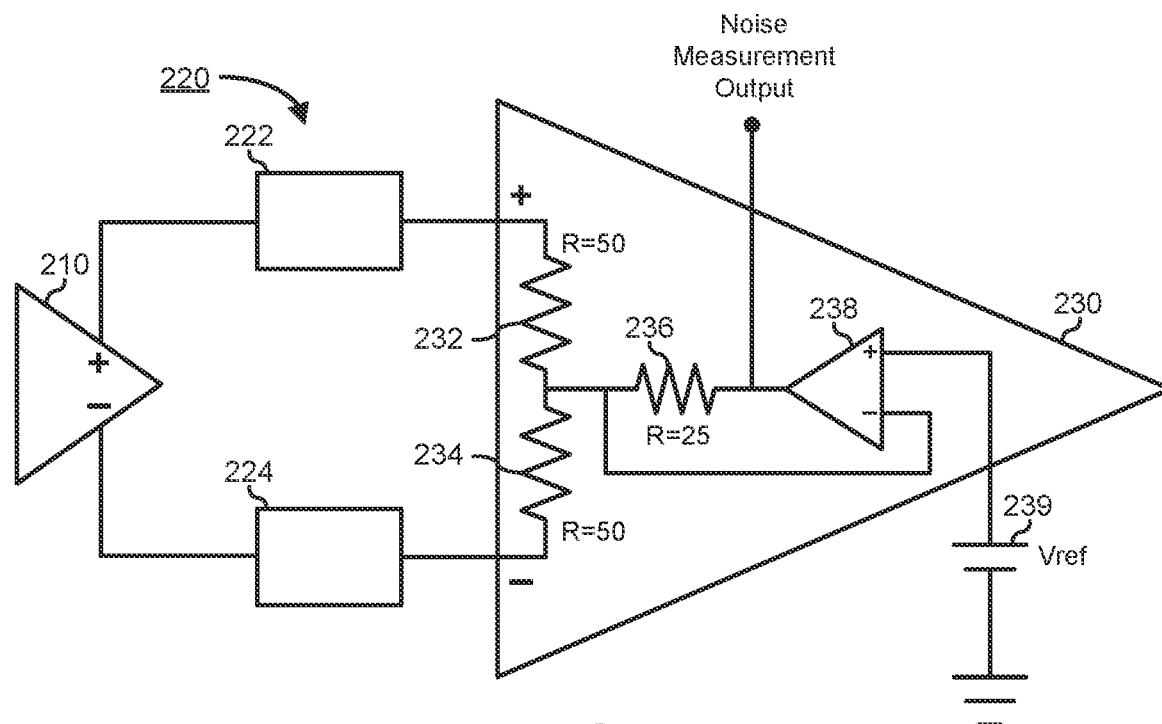
FIG. 2 is a block diagram of a high-speed differential signal data communication interface according to an embodiment of the current disclosure.

FIG. 2 illustrates an embodiment of a high-speed differential signal data communication interface 200 (hereinafter "interface 200"). Interface 200 includes a high-speed differential signal data communication interface transmitter 210 (hereinafter "transmitter 210"), a differential signal channel 220 (hereinafter "channel 220"), and a high-speed differential signal data communication receiver 230 (hereinafter "receiver 230"). Transmitter 210 is configured to receive data and to convert the data into a differential signal having a positive representation of the data on a positive output (+) of the transmitter, and a negative representation of the data on a negative output (−). The positive output (+) is connected to a positive trace 222 of differential signal channel 220, and the negative output (−) is connected to a negative trace 224 of the channel. Positive trace 222 and negative trace 224 represent tightly electrically coupled circuit paths that transmit the data from transmitter 210 to receiver 230, and may include traces of a differential signal trace pair instantiated on a printed circuit board) PCB), as contacts of a differential signal pair instantiated on a connector, a differential signal cable such as a twisted pair cable, or as other signal elements for carrying closely coupled differential signals as needed or desired.

Receiver 230 is similar to receiver 130, and includes termination resistors 232 and 234, a reference resistor 236, a reference voltage difference amplifier 238 (hereinafter "amplifier 238"), and a voltage source 239. Receiver 230 is configured to receive the data from channel 220. In particular, receiver 230 includes a positive input (+) connected to positive signal trace 222. Further, receiver 230 includes a negative input (−) connected to negative signal trace 224. Thus receiver 230 is configured to receive the data from channel 220 in the form of a differential signal as described above, and to provide the data on an output of the receiver (not illustrated).

Channel 220 is terminated in receiver 230 by termination resistors 232 and 234. In particular, a first terminal of termination resistor 232 is connected at the positive input (+) of receiver 230 to positive signal trace 222, and a first terminal of termination resistor 234 is connected at the negative input (−) of the receiver to negative signal trace 222. Second terminals of termination resistors 232 and 234 are connected together to form a reference voltage node. A positive input (+) of amplifier 238 is connected to a voltage plane at a reference voltage for the high-speed differential signal data communication interface by voltage source 239, an output of the amplifier is connected to a first terminal of reference resistor 236 at a noise measurement output node, and a second terminal of the reference resistor is connected to the reference voltage node and is fed back to a negative input (−) of the amplifier. In this configuration, amplifier 238 maintains a current opposite to the CM noise present on the voltage reference node while maintaining the reference voltage, and a voltage at the noise measurement output node is opposite of and proportional to the CM noise voltage.

Figure 3:
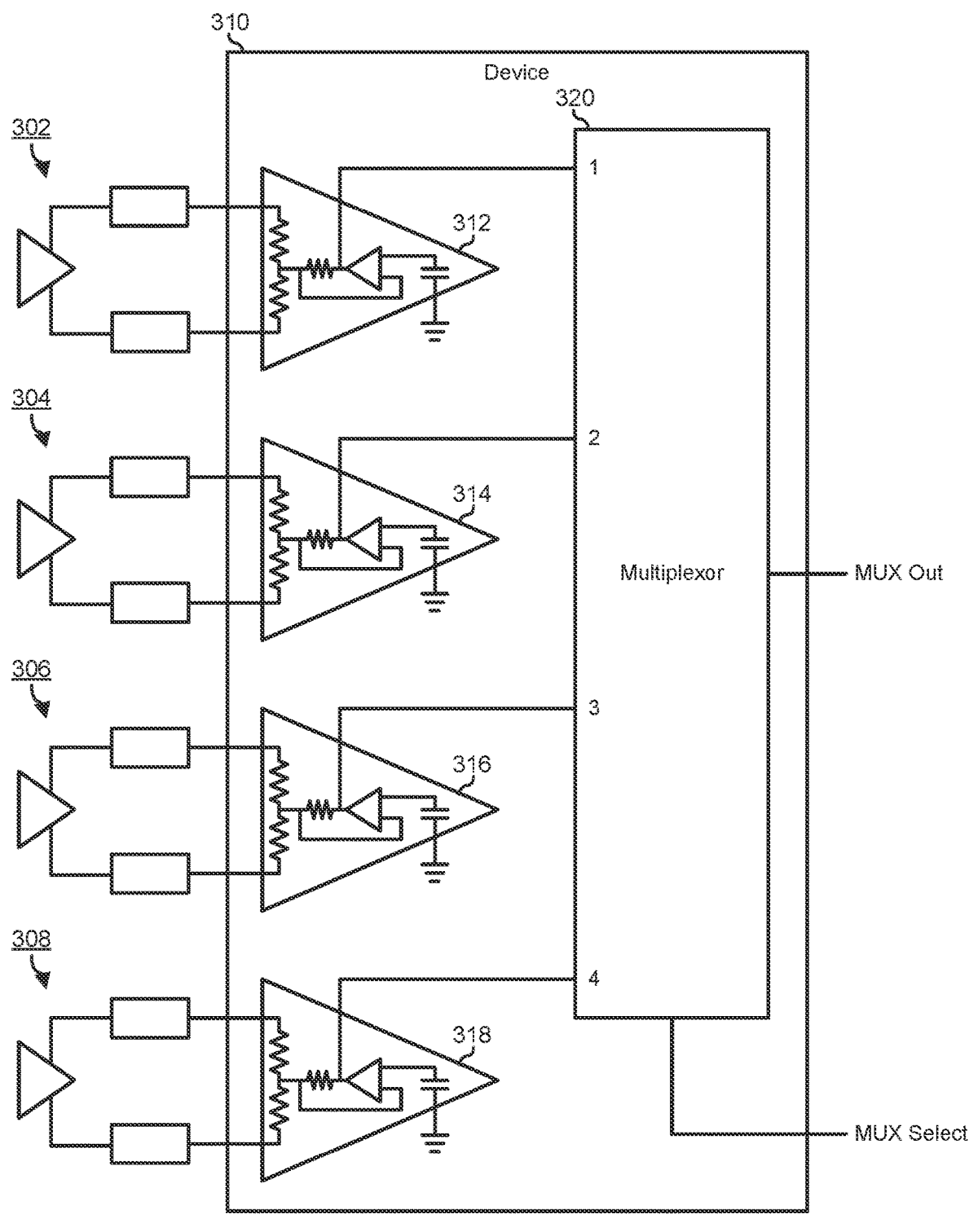
FIG. 3 is a block diagram of an information handling system according to an embodiment of the current disclosure.

FIG. 3 illustrates an information handling system 300 including high-speed serial data communication interfaces 302, 304, 206, and 208 (hereinafter "interfaces 302, 304, 306, and 408"), and an integrated circuit device 310. Interfaces 302, 304, 306, and 308 are similar to interface 200 and each include a respective high-speed differential signal data communication transmitters and an associated differential signal channel. Device 310 includes high-speed differential signal data communication interface receivers 213, 314, 316, and 318 (hereinafter "receivers 312, 314, 316, and 318"), and a multiplexor 320. Receivers 312, 314, 316, and 318 are similar to receiver 230, and each include an associated data output (not illustrated) and an associated noise measurement output node, as described above. Each of receivers 312, 314, 316, and 318 thus operates to maintain a voltage at their respective noise measurement output nodes that is opposite of and proportional to the CM noise voltage present at the associated voltage reference node.

Each noise measurement output node is connected to an associated signal input of multiplexor 320. Multiplexor 320 includes a selector input and a signal output. The selector operates to connect a selected one of the signal inputs to the signal output. In this way, the CM noise on each of receivers 312, 314, 316, and 318 can be measured by selecting the associated signal input. In the illustrated embodiment, the signal output and the selector input are provided at an interface of device 310. In this case, an outside agent, such as a management system for information handling system 300, or a design or service technician for the information handling system can access and measure the noise on each of receivers 312, 314, 316, and 318. In another embodiment, the signal output and the selector input are provided internally to an integrated circuit device, and the noise measurements may be maintained internally to the device. In a particular case, the signal output can be connected to a digital-to-analog converter so that the noise measurements can be provided externally to the device via, for example, a management interface such as an I2C interface or the like. While four receivers are illustrated, a greater or a fewer number of receivers may be provided on an integrated circuit device, and by adjusting the size of the associated multiplexor, any number of receiver CM noise measurements may be provided as needed or desired.

In a particular embodiment, the CM noise measurement capability of information handling system 300, as described above, is utilized during a design and development stage for information handling system 300. In this case, design and development technicians may utilize the CM noise measurement capability to verify, validate, or debug the design of the high-speed differential signal data communication interfaces, as needed or desired. In particular, a marginal design (such as where a particular high-speed differential signal data communication interface exhibits CM noise in excess of a design threshold) can be redesigned or otherwise slightly modified in manufacturing to improve the CM noise immunity of based upon the measurement capability. In another embodiment, the CM noise measurement capability of information handling system 300 is utilized during a boot process or a run time environment on the information handling system.

For example during the boot process, CM noise measurements may be incorporated into the link training process for the high-speed differential signal data communication interface, and the results of the measurements can be utilized to adjust the setup parameters for the interface. In another example, during the run time environment information handling system 300 may operate to monitor the bit error rate on receivers 312, 314, 316, and 318, and when one of the receivers exhibits a bit error rate in excess of a threshold, the information handling system can direct device 310 to measure the CM noise on the affected receiver, as needed or desired. In this case, information handling system 300 may operate to adjust the setup parameters for that particular receiver, to derate the transfer rate of the receiver, or the like.

Figure 4:
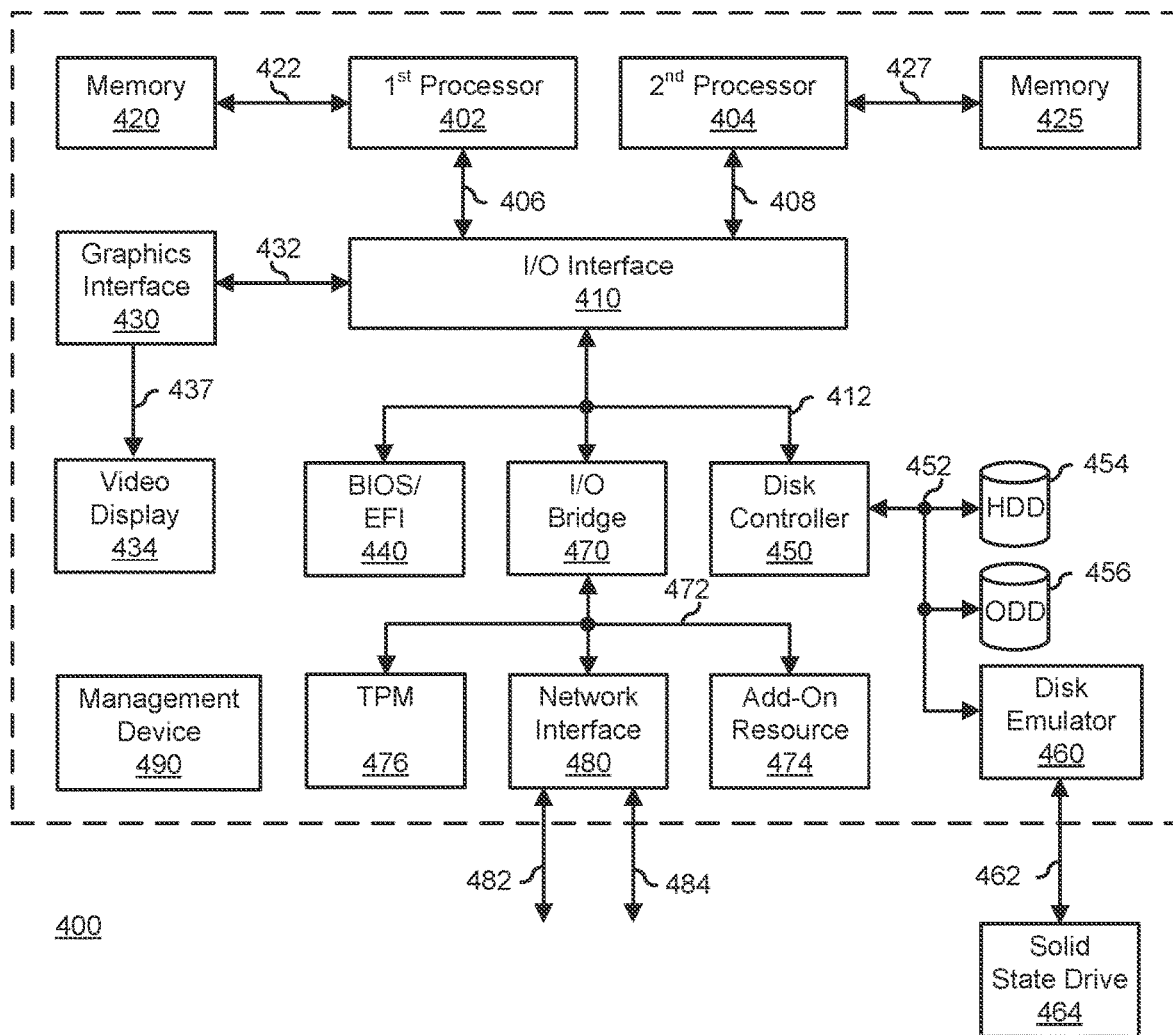
FIG. 4 is a block diagram illustrating a generalized information handling system according to another embodiment of the present disclosure.

FIG. 4 illustrates a generalized embodiment of an information handling system 400. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described below, and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432, and provides a video display output 436 to a video display 434. In a particular embodiment, information handling system 400 includes separate memories that are dedicated to each of processors 402 and 404 via separate memory interfaces. An example of memories 420 and 430 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 2394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412, or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400. Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A receiver for a high-speed data communication interface, the receiver comprising:
   a differential data signal input including a positive signal input and a negative signal input;
   a first termination resistor to terminate the positive signal input to a reference voltage node;
   a second termination resistor to terminate the negative signal input to the reference voltage node; and
   a noise measurement node coupled to detect common mode noise at the reference voltage node.

2. The receiver of claim 1, wherein the common mode noise includes uncancelled noise between the positive signal input and the negative signal input.

3. The receiver of claim 1, further comprising a difference amplifier having a first input to receive a reference voltage, a second input coupled to the reference voltage node, and an output to provide the noise measurement node.

4. The receiver of claim 3, further comprising a reference resistor coupled between the reference voltage node and the noise measurement node.

5. The receiver of claim 3, wherein the first input is a difference input and the second input is a summing input.

6. The receiver of claim 5, wherein a noise measurement at the noise measurement node is proportional to the common mode noise.

7. The receiver of claim 3, wherein the first input is a summing input and the second input is a difference input.

8. The receiver of claim 7, wherein a noise measurement at the noise measurement node is inversely proportional to the common mode noise.

9. The receiver of claim 1, wherein the first termination resistor and the second termination resistor provide an input impedance for the receiver.

10. The receiver of claim 9, wherein the input impedance is 50 ohms.

11. A method, comprising:
    providing, in a receiver of a high-speed data communication interface, a differential data signal input including a positive signal input and a negative signal input;
    coupling a first termination resistor to terminate the positive signal input to a reference voltage node;
    coupling a second termination resistor to terminate the negative signal input to the reference voltage node; and
    providing a noise measurement node coupled to detect common mode noise at the reference voltage node.

12. The method of claim 11, wherein the common mode noise includes uncancelled noise between the positive signal input and the negative signal input.

13. The method of claim 11, further comprising providing a difference amplifier having a first input to receive a reference voltage, a second input coupled to the reference voltage node, and an output to provide the noise measurement node.

14. The method of claim 13, further comprising providing a reference resistor coupled between the reference voltage node and the noise measurement node.

15. The method of claim 13, wherein the first input is a difference input and the second input is a summing input.

16. The method of claim 15, wherein a noise measurement at the noise measurement node is proportional to the common mode noise.

17. The method of claim 13, wherein the first input is a summing input and the second input is a difference input.

18. The method of claim 17, wherein a noise measurement at the noise measurement node is inversely proportional to the common mode noise.

19. The method of claim 11, wherein the first termination resistor and the second termination resistor provide an input impedance for the receiver.

20. A receiver circuit for a high-speed data communication interface, the receiver circuit comprising:
    a differential data signal input including a positive signal input and a negative signal input;
    a first termination resistor having a first terminal coupled to the positive signal input and a second terminal at a reference voltage node;
    a second termination resistor having a first terminal coupled to the negative signal input and a second terminal coupled to the second terminal of the first termination resistor at the reference voltage node;
    a difference amplifier having a first input terminal coupled to a reference voltage, a second input terminal coupled to the reference voltage node, and an output terminal to provide a noise measurement node; and
    a reference resistor coupled to the output terminal of the difference amplifier and a second terminal coupled to the second terminal of the first termination resistor and to the second terminal of the second termination resistor;
    wherein the receiver circuit is configured to provide at the noise measurement node a representation of common mode noise between the positive signal input and the negative signal input.

* * * * *